United States Patent
Prajapati et al.

(10) Patent No.: US 10,622,282 B2
(45) Date of Patent: Apr. 14, 2020

(54) SYSTEMS AND METHODS FOR COOLING AN ELECTRONIC DEVICE

(71) Applicant: QUALCOMM Incorporated, San Diego, CA (US)

(72) Inventors: Rupal Prajapati, San Diego, CA (US); Shujuan Wang, San Diego, CA (US); Peng Wang, San Diego, CA (US)

(73) Assignee: Qualcomm Incorporated, San Diego, CA (US)

( * ) Notice: Subject to any disclaimer, the term of this patent is extended or adjusted under 35 U.S.C. 154(b) by 0 days.

(21) Appl. No.: 15/663,680

(22) Filed: Jul. 28, 2017

(65) Prior Publication Data
US 2019/0035713 A1    Jan. 31, 2019

(51) Int. Cl.
*H01L 23/427*    (2006.01)
*H05K 7/20*    (2006.01)
(Continued)

(52) U.S. Cl.
CPC ....... *H01L 23/427* (2013.01); *H05K 7/20309* (2013.01); *H05K 7/20318* (2013.01);
(Continued)

(58) Field of Classification Search
CPC .............. H01L 23/427; H05K 7/20336; H05K 7/20318; H05K 7/20309
See application file for complete search history.

(56) References Cited

U.S. PATENT DOCUMENTS

| | | | | |
|---|---|---|---|---|
| 3,680,189 A | * | 8/1972 | Noren | B21D 53/02 |
| | | | | 29/890.032 |
| 4,011,535 A | * | 3/1977 | Kosky | H01F 27/18 |
| | | | | 336/57 |

(Continued)

FOREIGN PATENT DOCUMENTS

| | | |
|---|---|---|
| CN | 101106585 B | 3/2012 |
| JP | S56124252 A | 9/1981 |
| JP | 2009100374 A | 5/2009 |

OTHER PUBLICATIONS

Weibel J.A., et al., "Characterization of Evaporation and Boiling from Sintered Powder Wicks Fed by Capillary Action", International Journal of Heat and Mass Transfer, 2010, vol. 53, pp. 4204-4215.

(Continued)

*Primary Examiner* — Earl N Taylor
(74) *Attorney, Agent, or Firm* — Muncy, Geissler, Olds & Lowe, P.C.

(57) ABSTRACT

An apparatus for cooling an electronic device is disclosed. In an aspect, the apparatus includes a vapor chamber coupled to a heat generating component of the electronic device. In an aspect, the vapor chamber is coupled to an inner surface of an outer cover of the electronic device and conforms to a shape of the inner surface of the outer cover. In another aspect, the vapor chamber forms the outer cover of the electronic device. The vapor chamber comprises a sealed container, a wick structure disposed on an inner surface of the sealed container, and a fluid contained in the (Continued)

sealed container, wherein as heat is applied to an evaporator side of the sealed container coupled to the heat generating component, the fluid vaporizes over a condenser side of the sealed container opposite the evaporator side and returns to the evaporator side via the wick structure.

20 Claims, 3 Drawing Sheets

(51) Int. Cl.
    *H01L 27/146*     (2006.01)
    *H03F 1/30*     (2006.01)
    *H03F 3/21*     (2006.01)

(52) U.S. Cl.
    CPC .... *H05K 7/20336* (2013.01); *H01L 27/14618* (2013.01); *H03F 1/30* (2013.01); *H03F 3/21* (2013.01); *H03F 2200/447* (2013.01)

(56) References Cited

U.S. PATENT DOCUMENTS

| | | | | |
|---|---|---|---|---|
| 4,047,198 | A * | 9/1977 | Sekhon | H01L 23/42 257/713 |
| 4,914,551 | A * | 4/1990 | Anschel | H01L 23/3675 257/713 |
| 5,455,457 | A * | 10/1995 | Kurokawa | H01L 23/3737 257/704 |
| 5,880,524 | A * | 3/1999 | Xie | H01L 23/427 257/704 |
| 6,008,536 | A * | 12/1999 | Mertol | H01L 23/367 257/704 |
| 6,082,443 | A * | 7/2000 | Yamamoto | F28D 15/0233 165/104.21 |
| 6,133,631 | A * | 10/2000 | Belady | F28D 15/0233 257/714 |
| 6,212,074 | B1 * | 4/2001 | Gonsalves | H01L 23/4006 165/185 |
| 6,293,333 | B1 * | 9/2001 | Ponnappan | F28D 15/0233 165/104.26 |
| 6,294,831 | B1 * | 9/2001 | Shishido | H01L 21/563 257/687 |
| 6,407,922 | B1 * | 6/2002 | Eckblad | B82Y 10/00 165/185 |
| 6,410,982 | B1 * | 6/2002 | Brownell | F28D 15/0266 257/713 |
| 6,418,019 | B1 * | 7/2002 | Snyder | H01L 23/427 361/700 |
| 6,525,420 | B2 * | 2/2003 | Zuo | H01L 23/427 257/704 |
| 6,535,388 | B1 * | 3/2003 | Garcia | H01L 23/24 165/80.3 |
| 6,653,730 | B2 * | 11/2003 | Chrysler | H01L 23/36 257/704 |
| 6,665,187 | B1 * | 12/2003 | Alcoe | H01L 23/10 165/185 |
| 6,751,099 | B2 * | 6/2004 | Vrtis | H01L 23/3735 156/303.1 |
| 6,901,994 | B1 * | 6/2005 | Jin-Cherng | F28D 15/046 165/104.26 |
| 7,005,738 | B2 * | 2/2006 | Zuo | H01L 23/427 257/704 |
| 7,007,746 | B2 * | 3/2006 | Wu | F28D 15/043 165/104.26 |
| 7,032,652 | B2 * | 4/2006 | Wang | F28D 15/0233 165/104.26 |
| 7,032,653 | B1 * | 4/2006 | Chang | F28D 15/04 165/104.26 |
| 7,193,851 | B2 * | 3/2007 | Yatskov | H01L 23/4006 165/80.3 |
| 7,301,227 | B1 * | 11/2007 | Gektin | H01L 23/04 257/680 |
| 7,411,790 | B2 * | 8/2008 | Huang | H01L 23/427 165/104.33 |
| 7,432,591 | B1 * | 10/2008 | Yamada | H01L 23/4334 257/705 |
| 7,609,520 | B2 * | 10/2009 | Chang | F28D 15/0233 165/104.33 |
| 7,671,466 | B2 * | 3/2010 | Pu | H01L 23/3157 257/707 |
| 7,856,711 | B2 * | 12/2010 | Lu | H01L 23/427 29/852 |
| 7,906,845 | B1 * | 3/2011 | Galloway | H01L 23/04 257/707 |
| 8,058,724 | B2 * | 11/2011 | Refai-Ahmed | H01L 23/3732 257/706 |
| 8,063,482 | B2 * | 11/2011 | Lu | H01L 23/04 257/678 |
| 8,087,254 | B2 * | 1/2012 | Arnold | A41D 13/005 62/3.5 |
| 8,455,998 | B2 * | 6/2013 | Iruvanti | H01L 23/10 257/704 |
| 8,659,892 | B2 * | 2/2014 | Yan | H01L 23/427 165/104.33 |
| 8,813,834 | B2 * | 8/2014 | Chin | F28D 15/025 165/104.26 |
| 8,970,029 | B2 * | 3/2015 | Lin | H01L 23/04 165/104.21 |
| 8,981,550 | B2 * | 3/2015 | Park | H01L 23/42 257/675 |
| 9,024,434 | B2 * | 5/2015 | Im | H01L 23/3128 257/704 |
| 9,041,192 | B2 * | 5/2015 | Saeidi | H01L 23/16 257/675 |
| 9,385,055 | B2 * | 7/2016 | Refai-Ahmed | H01L 23/04 |
| 10,224,264 | B1 * | 3/2019 | Merrikh | H01L 23/427 |
| 10,262,920 | B1 * | 4/2019 | Refai-Ahmed | H01L 23/4275 |
| 2002/0056908 | A1 * | 5/2002 | Brownell | F28D 15/0266 257/714 |
| 2002/0100968 | A1 * | 8/2002 | Zuo | H01L 23/427 257/715 |
| 2004/0070069 | A1 * | 4/2004 | Subramanian | H01L 23/04 257/704 |
| 2004/0118579 | A1 * | 6/2004 | McCutcheon | F28D 15/0241 174/16.3 |
| 2004/0261980 | A1 * | 12/2004 | Dani | H01L 23/10 165/104.33 |
| 2005/0045310 | A1 * | 3/2005 | Okutsu | F28D 15/0233 165/80.3 |
| 2005/0201060 | A1 * | 9/2005 | Huang | H01L 23/427 361/700 |
| 2005/0255015 | A1 * | 11/2005 | Le | B01F 5/0603 422/198 |
| 2006/0043553 | A1 * | 3/2006 | Yang | H01L 23/4093 257/678 |
| 2006/0185827 | A1 * | 8/2006 | Huang | F28D 15/0266 165/104.25 |
| 2007/0045819 | A1 * | 3/2007 | Edwards | H01L 23/04 257/704 |
| 2007/0242438 | A1 * | 10/2007 | Belits | F28D 15/0266 361/700 |
| 2007/0267179 | A1 * | 11/2007 | Hou | F28D 15/046 165/104.26 |
| 2008/0001268 | A1 * | 1/2008 | Lu | H01L 21/6836 257/678 |
| 2008/0036076 | A1 * | 2/2008 | Ouyang | H01L 23/34 257/714 |
| 2008/0042142 | A1 * | 2/2008 | Sugawara | C08G 77/04 257/77 |
| 2008/0237845 | A1 * | 10/2008 | Kim | G06F 1/203 257/715 |
| 2008/0283222 | A1 * | 11/2008 | Chang | H01L 23/427 165/104.26 |
| 2008/0302505 | A1 * | 12/2008 | Kato | F25B 23/006 165/61 |
| 2009/0056917 | A1 * | 3/2009 | Majumdar | F28D 15/0233 165/104.26 |

(56) References Cited

U.S. PATENT DOCUMENTS

| | | | | | |
|---|---|---|---|---|---|
| 2009/0057928 | A1* | 3/2009 | Zhai | | H01L 21/563 257/789 |
| 2010/0046574 | A1* | 2/2010 | Hamann | | H01L 23/34 374/43 |
| 2010/0128436 | A1* | 5/2010 | Edmunds | | H01L 23/427 361/700 |
| 2010/0254090 | A1* | 10/2010 | Trautman | | F28D 15/046 361/704 |
| 2011/0017431 | A1* | 1/2011 | Yang | | F28D 15/046 165/104.26 |
| 2011/0094712 | A1* | 4/2011 | Hou | | F28D 15/0233 165/104.26 |
| 2011/0108243 | A1* | 5/2011 | Hou | | F28D 15/046 165/104.26 |
| 2011/0146956 | A1* | 6/2011 | Stroock | | F28D 15/046 165/104.26 |
| 2011/0174474 | A1* | 7/2011 | Liu | | C23C 28/30 165/185 |
| 2012/0043668 | A1* | 2/2012 | Refai-Ahmed | | H01L 23/04 257/777 |
| 2012/0235421 | A1* | 9/2012 | Wong | | F03D 80/60 290/55 |
| 2012/0307453 | A1* | 12/2012 | Yan | | H01L 23/427 361/704 |
| 2012/0312506 | A1* | 12/2012 | Uchida | | F28D 15/0266 165/104.21 |
| 2013/0255921 | A1* | 10/2013 | Dai | | F28D 15/04 165/104.26 |
| 2014/0266850 | A1* | 9/2014 | Suorsa | | H05K 9/0088 342/1 |
| 2014/0268578 | A1* | 9/2014 | Dolci | | H05K 9/0049 361/719 |
| 2015/0041103 | A1* | 2/2015 | Kiley | | F28D 15/046 165/104.26 |
| 2015/0179617 | A1* | 6/2015 | Lin | | H01L 25/0657 257/713 |
| 2015/0198380 | A1* | 7/2015 | Haj-Hariri | | B64G 1/50 62/3.2 |
| 2016/0095254 | A1* | 3/2016 | Mann | | B23P 15/26 361/700 |
| 2016/0205723 | A1* | 7/2016 | Reiffenrath | | H04W 88/06 455/552.1 |
| 2016/0227673 | A1* | 8/2016 | Ramones | | H01L 23/3672 |
| 2016/0255929 | A1* | 9/2016 | Nazzaro | | A45C 11/00 |
| 2016/0343639 | A1* | 11/2016 | Groothuis | | F28D 15/046 |
| 2017/0092561 | A1* | 3/2017 | Eid | | H01L 21/4882 |
| 2017/0163077 | A1* | 6/2017 | Lindner | | H02J 7/0042 |
| 2017/0236769 | A1* | 8/2017 | Dutta | | H01L 23/3735 165/81 |
| 2017/0236804 | A1* | 8/2017 | Hembree | | H01L 23/42 257/704 |
| 2017/0245393 | A1* | 8/2017 | Kim | | F28D 15/0266 |
| 2017/0295671 | A1* | 10/2017 | Chiriac | | G06F 1/203 |
| 2017/0315596 | A1* | 11/2017 | Torres | | G06F 1/20 |
| 2017/0338167 | A1* | 11/2017 | Bozorgi | | F28F 21/086 |
| 2018/0082938 | A1* | 3/2018 | Chan | | H01L 23/49838 |
| 2018/0090415 | A1* | 3/2018 | Escobar-Vargas | | H01L 23/427 |
| 2018/0106554 | A1* | 4/2018 | Lewis | | F28D 15/04 |
| 2018/0120912 | A1* | 5/2018 | Jenkins | | B33Y 70/00 |
| 2018/0128553 | A1* | 5/2018 | Lewis | | F28D 15/046 |
| 2018/0143673 | A1* | 5/2018 | Jenkins | | F28D 15/04 |
| 2018/0157297 | A1* | 6/2018 | Delano | | G06F 1/206 |
| 2018/0177077 | A1* | 6/2018 | Shioga | | H01L 23/427 |
| 2018/0201388 | A1* | 7/2018 | Du | | B64D 33/08 |
| 2018/0288908 | A1* | 10/2018 | Lee | | H05K 9/003 |
| 2018/0299206 | A1* | 10/2018 | Kim | | F28D 15/0241 |
| 2018/0308784 | A1* | 10/2018 | Jha | | H01L 23/24 |
| 2018/0320985 | A1* | 11/2018 | Salim Shirazy | | F28D 15/046 |
| 2018/0356156 | A1* | 12/2018 | Hurbi | | F28C 3/08 |
| 2018/0372424 | A1* | 12/2018 | Hurbi | | F28B 20/025 |
| 2019/0035713 | A1* | 1/2019 | Prajapati | | H01L 23/427 |
| 2019/0067205 | A1* | 2/2019 | Rae | | H01L 23/552 |
| 2019/0074252 | A1* | 3/2019 | Chigullapalli | | H01L 23/552 |

OTHER PUBLICATIONS

International Search Report and Written Opinion—PCT/US2018/043600—ISA/EPO—dated Oct. 2, 2018.

\* cited by examiner

SYSTEMS AND METHODS FOR COOLING AN ELECTRONIC DEVICE

BACKGROUND

1. Field of the Disclosure

Aspects relate to systems and methods for cooling an electronic device.

2. Description of the Related Art

Microprocessor performance has improved significantly over time, due to an increase in the density of the circuitry. Specifically, more and more transistors can be fabricated on a smaller chip size. This has in turn led to an exponential rise in chip package power densities, and this trend is expected to continue into the foreseeable future.

Almost all of the electrical energy consumed by the chip package is released into the surroundings as heat, which places a large burden on the cooling device and cooling package. Existing cooling devices typically utilize air or water to carry the heat away from the chip package. Heat sinks and/or heat pipes are commonly used air-cooling devices, while cold-plates are most predominant in water-cooling. These cooling devices are attached to the chip package via a thermal conductive interface. A "cooling package" may include the cooling device, the thermal conductive interface between the cooling package and the chip package, and the chip package. Note that a "chip package" may also be referred to herein as an integrated circuit, a processor, a microprocessor, a microchip, or any other set of electronic circuits manufactured on a piece ("chip") of semiconductor material, such as silicon.

SUMMARY

The following presents a simplified summary relating to one or more aspects disclosed herein. As such, the following summary should not be considered an extensive overview relating to all contemplated aspects, nor should the following summary be regarded to identify key or critical elements relating to all contemplated aspects or to delineate the scope associated with any particular aspect. Accordingly, the following summary has the sole purpose to present certain concepts relating to one or more aspects relating to the mechanisms disclosed herein in a simplified form to precede the detailed description presented below.

In an aspect, an apparatus for cooling an electronic device includes a vapor chamber coupled to a heat generating component of the electronic device, the vapor chamber comprising a sealed container having an evaporator side and a condenser side opposite the evaporator side, a wick structure disposed on an inner surface of the sealed container, and a fluid contained in the sealed container, wherein: the evaporator side of the sealed container is coupled to the heat generating component, the condenser side of the sealed container is coupled to an inner surface of an outer cover of the electronic device, the condenser side of the sealed container conforms to a shape of the inner surface of the outer cover of the electronic device, and as heat is generated by the heat generating component, the fluid vaporizes over the condenser side of the sealed container and returns to the evaporator side of the sealed container via the wick structure.

In an aspect, an apparatus for cooling an electronic device includes a vapor chamber coupled to a heat generating component of the electronic device, the vapor chamber comprising a sealed container having an evaporator side and a condenser side opposite the evaporator side, a wick structure disposed on an inner surface of the sealed container, and a fluid contained in the sealed container, wherein: the vapor chamber forms an outer cover of the electronic device, the evaporator side of the sealed container is coupled to the heat generating component, as heat is generated by the heat generating component, the fluid vaporizes over the condenser side of the sealed container and returns to the evaporator side of the sealed container via the wick structure.

In an aspect, an apparatus for cooling an electronic device includes a cooling means coupled to a heat generating means of the electronic device, wherein the cooling means comprises a sealed container having an evaporator side and a condenser side opposite the evaporator side, a wicking means disposed on an inner surface of the sealed container, and a fluid contained in the sealed container, wherein: the evaporator side of the sealed container is coupled to the heat generating means, the condenser side of the sealed container is coupled to an inner surface of an outer cover of the electronic device, the condenser side of the sealed container conforms to a shape of the inner surface of the outer cover of the electronic device, and as heat is generated by the heat generating means, the fluid vaporizes over the condenser side of the sealed container and returns to the evaporator side of the sealed container via the wicking means.

In an aspect, an apparatus for cooling an electronic device includes a cooling means coupled to a heat generating means of the electronic device, wherein the cooling means comprises a sealed container having an evaporator side and a condenser side opposite the evaporator side, a wicking means disposed on an inner surface of the sealed container, and a fluid contained in the sealed container, wherein: the cooling means forms an outer cover of the electronic device, the evaporator side of the sealed container is coupled to the heat generating means, as heat is generated by the heat generating means, the fluid vaporizes over the condenser side of the sealed container and returns to the evaporator side of the sealed container via the wick structure.

Other objects and advantages associated with the aspects disclosed herein will be apparent to those skilled in the art based on the accompanying drawings and detailed description.

BRIEF DESCRIPTION OF THE DRAWINGS

A more complete appreciation of aspects of the disclosure will be readily obtained as the same becomes better understood by reference to the following detailed description when considered in connection with the accompanying drawings which are presented solely for illustration and not limitation of the disclosure, and in which.

DETAILED DESCRIPTION

An apparatus for cooling an electronic device is disclosed. In an aspect, the apparatus includes a vapor chamber coupled to a heat generating component of the electronic device. In an aspect, the vapor chamber is coupled to an inner surface of an outer cover of the electronic device and conforms to a shape of the inner surface of the outer cover of the electronic device. In another aspect, the vapor chamber forms the outer cover of the electronic device. The vapor chamber comprises a sealed container, a wick structure disposed on an inner surface of the sealed container, and a fluid contained in the sealed container, wherein as heat is applied to an evaporator side of the sealed container coupled to the heat generating component of the electronic device, the fluid vaporizes over a condenser side of the sealed container opposite the evaporator side and returns to the evaporator side of the sealed container via the wick structure.

These and other aspects of the disclosure are disclosed in the following description and related drawings directed to specific aspects of the disclosure. Alternate aspects may be devised without departing from the scope of the disclosure. Additionally, well-known elements of the disclosure will not be described in detail or will be omitted so as not to obscure the relevant details of the disclosure.

The words "exemplary" and/or "example" are used herein to mean "serving as an example, instance, or illustration." Any aspect described herein as "exemplary" and/or "example" is not necessarily to be construed as preferred or advantageous over other aspects. Likewise, the term "aspects of the disclosure" does not require that all aspects of the disclosure include the discussed feature, advantage or mode of operation.

As noted above, microprocessor performance has improved significantly over time, due to an increase in the density of the circuitry. Specifically, more and more transistors can be fabricated on a smaller chip size. This has in turn led to an exponential rise in chip package power densities, and this trend is expected to continue into the foreseeable future.

Almost all of the electrical energy consumed by the chip package is released into the surroundings as heat, which places a large burden on the cooling device and cooling package. For example, modern security cameras are expected to operate continuously at very high resolutions, which generate a significant amount of heat. A challenge to cooling a security camera, and similar small form devices such as wearable cameras, smartphones, tablet computers, and the like, is that there is often only a very small surface area for thermal cooling. If such a device "overheats," it may be programmed to shut down or reduce functionality.

For example, referring again to the security camera example, a security camera may be designed to only allow a 10° Celsius difference between the temperature of the outer skin of the camera and the temperature of the chip package. Further, the on-die junction temperature may be 10° higher than the temperature of the chip package. Thus, if the maximum allowable skin temperature is 52° Celsius, then the chip package would only be permitted to reach a temperature of 62° Celsius and the temperature of the on-die junction would be limited to 72° Celsius. Upon the temperature of the chip package approaching 62° Celsius then, the camera may reduce the resolution and/or frame rate at which it is recording to reduce the amount of heat generated by the chip package, and upon reaching 62° Celsius, the camera may shut down.

Existing cooling devices typically utilize air or water to carry the heat away from the chip package. Heat sinks and/or heat pipes are commonly used air-cooling devices, while cold-plates are most predominant in water-cooling. These cooling devices are attached to the chip package via a thermal conductive interface. However, in the case of small devices, such as security cameras, wearable cameras, etc., there is only a small amount of surface area that can be used to cool the chip package, and thus, typical cooling devices may be inadequate to maintain the temperature of the chip package within a normal operational range.

Accordingly, disclosed herein is a vapor chamber that can be incorporated into the body of an electronic device to more effectively cool the system and thereby enable higher performance. The disclosed vapor chamber spreads heat from a concentrated heat source, such as the chip package, to a large area, such as the back cover of the electronic device, with effective thermal conductivities greatly exceeding copper. The vapor chamber allows for a greater temperature differential between the outer skin of the electronic device and the chip package, which translates into a higher temperature threshold for the chip package's on-die junction temperature while maintaining the same skin temperature threshold.

For example, referring again to the security camera example, by incorporating the disclosed vapor chamber into the security camera, the thermal benefit may be an improvement of, for example, 10° Celsius between the temperature of the chip package and the temperature of the outer skin of the security camera, depending on the design of the security camera. More specifically, if the maximum allowable skin temperature is still 52° Celsius, the 10° increase in the thermal benefit provided by the disclosed vapor chamber would permit the chip package to reach a temperature of 72° Celsius (10° higher than without the vapor chamber), meaning the temperature of the on-die junction could reach 82° Celsius, before the security camera would have to reduce performance or shut down. As such, by using the disclosed vapor chamber, less heat will be transmitted to the skin of the electronic device from the chip package, and therefore, the electronic device can operate longer without reducing functionality (e.g., without reducing resolution or frame rate). In fact, the electronic device may not cross the temperature threshold at which it is designed to reduce functionality. Reducing the temperature of the thermal junction also improves the power efficiency of an electronic device. In testing the specific security camera example, this translated into an improved efficiency of approximately 3 Watts of power.

Figure 1:
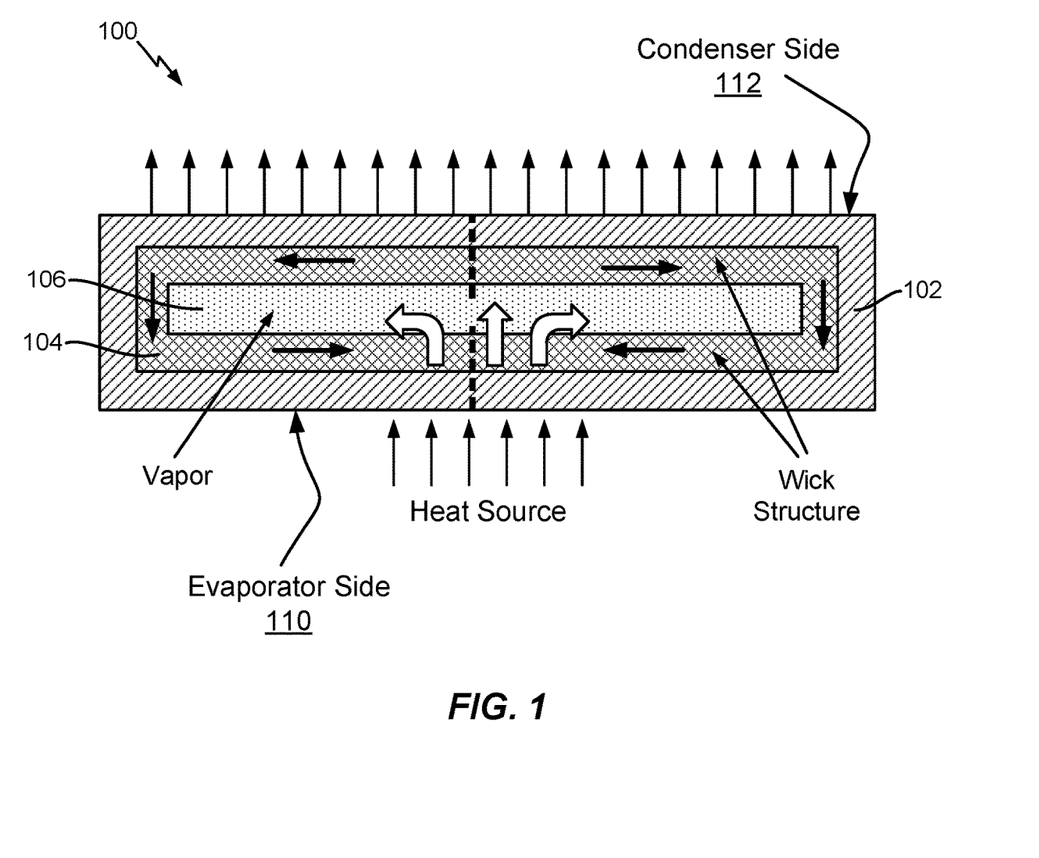
FIG. 1 is a cross sectional side view of an exemplary vapor chamber according to an aspect of the disclosure.

FIG. 1 is a cross sectional side view of an exemplary vapor chamber 100 according to an aspect of the disclosure. The vapor chamber 100 includes a sealed container 102, a wick structure 104 formed on the inner surface of the sealed container 102, and a cavity 106 formed by the sealed container 102 and the wick structure 104 and containing a small amount of fluid that is in equilibrium with its own vapor (e.g., water). As illustrated in FIG. 1, as heat is applied to one side of the sealed container 102 (referred to as the "evaporator side" of the vapor chamber 100 and labelled with reference number 110), that side of the sealed container 102 heats up, which in turn heats up the corresponding side of the wick structure 104, which then causes the working fluid (e.g., water) in the cavity 106 to vaporize. The vapor spreads within the cavity 106 to the "condenser side" of the vapor chamber 100 (labelled with reference number 112) due to vapor pressure drop, condenses back into the liquid, and releases the latent heat. The condensate is returned to the evaporator side 110 of the vapor chamber 100 via the capillary forces developed in the wick structure 104, and the cycle repeats.

In an aspect, the sealed container 102 may be formed from a conductive metal, such as copper or aluminum, a polymer, or any material to which the wick structure 104 can be attached and that can conduct heat from a heat source to the wick structure 104. In addition, the entire sealed container 102 does not need to be formed of the same material. For example, the evaporator side 110 and walls of the sealed container 102 may be formed from a conductive metal, while the condenser side 112 of the sealed container 102 may be formed from a polymer. As will be appreciated, the more effective the chosen material is at conducting heat, the more effective the sealed container 102 will be at transferring heat from the heat source to the wick structure 104.

In an aspect, the wick structure 104 may be a copper powder, a copper or aluminum mesh, a fibrous material, carbon fiber, grooves on the inner surface of the sealed container 102, or any material or structure that can wick fluid from the cooler condensate side of the vapor chamber 100 to the warmer evaporator side 110 of the vapor chamber 100. If a copper powder is used as the wick structure 104, the copper powder can be sintered to the inner surface of the sealed container 102, as is known in the art.

In an aspect, the working fluid within the cavity 106 may be water. As is known in the art, in order for water to vaporize at a temperature less than 100° Celsius (the temperature at which water boils at one (1) atmosphere of pressure), the pressure in the vapor chamber 100 can be reduced below one (1) atmosphere of pressure. While the example of water is given as the substance for the working fluid, other fluids can be used, such as ammonia, alcohol, methanol, or ammonia, alcohol, or methanol based fluids.

As mentioned above, the vapor chamber of the present disclosure may be incorporated into the body of an electronic device. In an aspect, the vapor chamber may form a cover, such as the back cover, of the electronic device. Thus, referring to the security camera example above, the vapor chamber may be the back cover of the security camera.

Figure 2A:
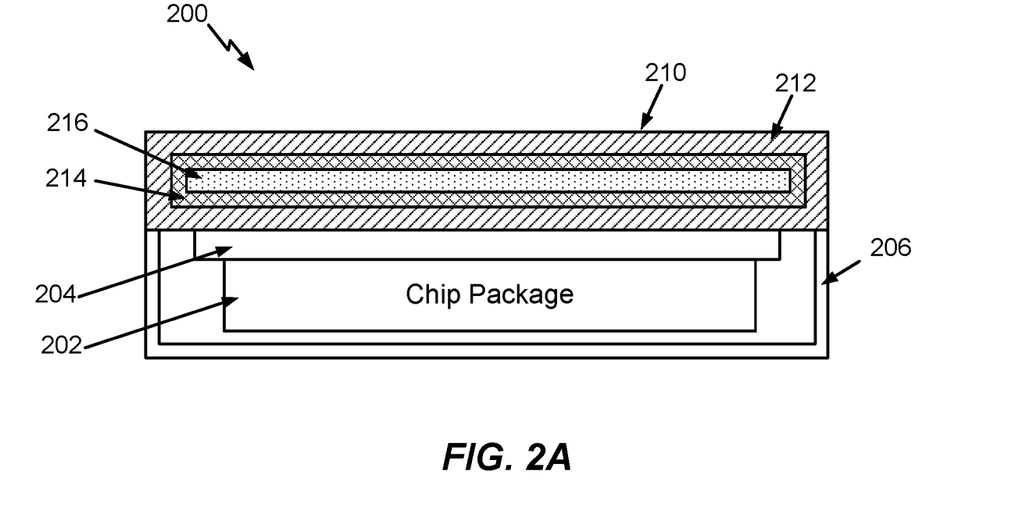
FIG. 2A is a cross sectional side view of an exemplary electronic device that includes a vapor chamber according to an aspect of the disclosure.

FIG. 2A is a cross sectional side view of an exemplary electronic device 200 that includes a vapor chamber 210 according to an aspect of the disclosure. The electronic device 200 may be any small form factor electronic device that would benefit from having a cooling package, such as a cell phone, security camera, wearable device, Internet of Things (IoT) device, etc. The vapor chamber 210 is an example configuration of the vapor chamber 100 in FIG. 1. Like the vapor chamber 100 discussed above with reference to FIG. 1, the vapor chamber 210 includes a sealed container 212, a wick structure 214, and a cavity 216. As shown in FIG. 2A, the electronic device 200 further includes a chip package 202 and a thermally conductive interface 204 between the chip package 202 and the sealed container 212 of the vapor chamber 210.

The chip package 202 may be an integrated circuit, a processor, a microprocessor, a microchip, or any other set of electronic circuits manufactured on a piece ("chip") of semiconductor material, such as silicon. Alternatively, although a chip package 202 is illustrated in FIG. 2A, the chip package 202 may instead be an image sensor, a power amplifier, or any other heat generating circuitry that would benefit from a cooling package. The thermally conductive interface 204 may be grease, epoxy, solder, or any material that allows heat generated by the chip package 202 to be transferred to the sealed container 212. Referring to FIG. 1, the "heat source" referred to in the description of FIG. 1 would be the thermally conductive interface 204, the side of the sealed container 212 coupled to the thermally conductive interface 204 would be the evaporator side of the sealed container 212, and the side of the sealed container 212 opposite the thermally conductive interface 204 would be the condenser side of the sealed container 212.

As illustrated in FIG. 2A, a first outside cover 206 of the electronic device 200 is coupled to the sealed container 212 along an outside edge of the sealed container 212. As such, the exposed surfaces of the sealed container 212 (i.e., those surfaces of the sealed container not covered by the first outside cover 206) form a second outside cover of the electronic device 200. As an example, the first outside cover 206 may be the front cover of the electronic device 200 and the sealed container 212 may be the back cover of the electronic device 200. The first outside cover 206 and the sealed container 212 may be coupled to each other by any means known in the art for coupling the outside covers of an electronic device.

Figure 2B:
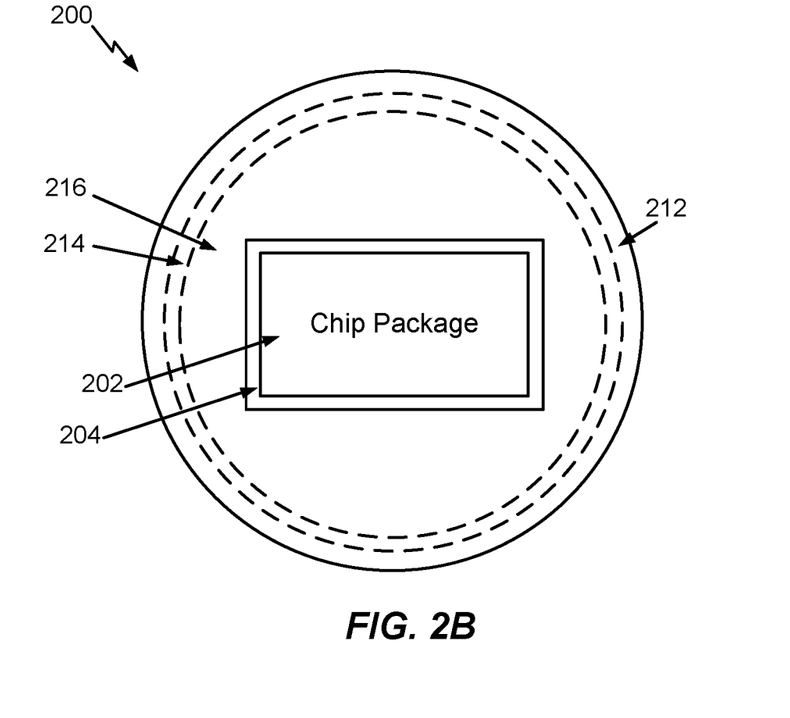
FIG. 2B is a bottom view of the electronic device of FIG. 2A according to an aspect of the disclosure.

FIG. 2B illustrates a bottom view of the exemplary electronic device 200 according to an aspect of the disclosure. In the example of FIG. 2B, the first outside cover 206 has been removed, exposing the chip package 202 mounted, via the thermally conductive interface 204, to the sealed container 212. As shown in FIG. 2B, the electronic device 200 is circular in shape. The borders of the wick structure 214 and the cavity 216 within the sealed container 212 are indicated by dashed lines. As can be seen from FIGS. 2A and 2B, the sealed container 212 forms the entire back cover of the electronic device 200.

As mentioned above, the vapor chamber of the present disclosure may be coupled to an inner surface of an outer cover of the electronic device and conform to a shape of the inner surface of the outer cover of the electronic device. Thus, referring to the security camera example above, the vapor chamber may be coupled to and conform to the inner surface of the back cover of the security camera.

Figure 3:
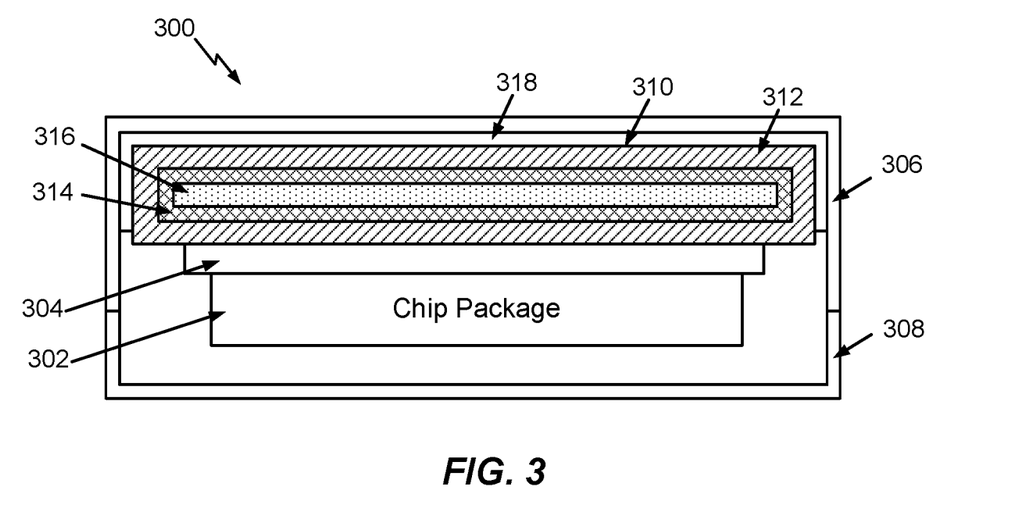
FIG. 3 is a cross sectional side view of an exemplary electronic device that includes a vapor chamber according to an aspect of the disclosure.

FIG. 3 is a cross sectional side view of an exemplary electronic device 300 that includes a vapor chamber 310 according to an aspect of the disclosure. The vapor chamber 310 is an example configuration of the vapor chamber 100 in FIG. 1. Like the vapor chamber 100 discussed above with reference to FIG. 1, the vapor chamber 310 includes a sealed container 312, a wick structure 314, and a cavity 316. As shown in FIG. 3, the electronic device 300 further includes a chip package 302 (similar to the chip package 202) and a thermally conductive interface 304 (similar to the thermally conductive interface 204) between the chip package 302 and the sealed container 312 of the vapor chamber 310. As in FIGS. 2A and 2B, although a chip package 302 is illustrated in FIG. 3, the chip package 302 may instead be an image sensor, a power amplifier, or any other heat generating circuitry that would benefit from a cooling package.

As illustrated in FIG. 3, the electronic device 300 has a first outside cover 306 and a second outside cover 308. As an example, the first outside cover 306 may be the back cover of the electronic device 300 and the second outside cover 308 may be the front cover of the electronic device 300. The outside covers 306 and 308 may be metal or polymer, and may be coupled to each other by any means known in the art for coupling the outside covers of an electronic device. In the example of FIG. 3, the sealed container 312 is thermally coupled, via a thermally conductive interface 318, to the first outside cover 306 of the electronic device 300. The thermally conductive interface 318 may be grease, epoxy, solder, or any material that allows heat from the sealed container 312 to be transferred to the first outside cover 306. The thermally conductive interface 318 may surround the entirety of the vapor chamber 310, or less than the entirety of the vapor chamber 310 (as illustrated in FIG. 3). As shown in FIG. 3, the sealed container 312 conforms to the entire inside back surface of the first outside cover 306. The walls of the first outside cover 306 may (as illustrated in FIG. 3), but need not, extend beyond the thickness of the sealed container 312.

Figure 4:
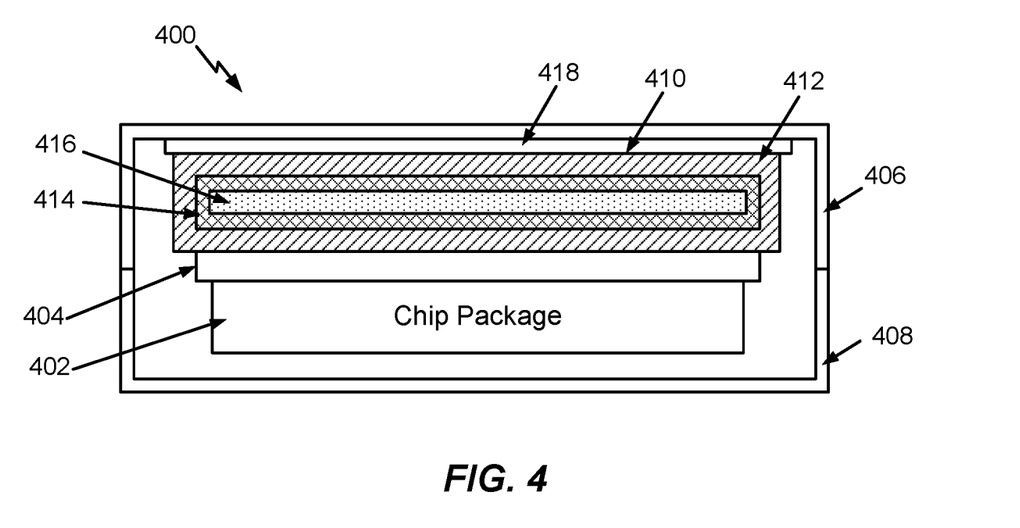
FIG. 4 is a cross sectional side view of an exemplary electronic device that includes a vapor chamber according to an aspect of the disclosure.

FIG. 4 is a cross sectional side view of an exemplary electronic device 400 that includes a vapor chamber 410 according to an aspect of the disclosure. The vapor chamber 410 is an example configuration of the vapor chamber 100 in FIG. 1. Like the vapor chamber 100 discussed above with reference to FIG. 1, the vapor chamber 410 includes a sealed container 412, a wick structure 414, and a cavity 416. As shown in FIG. 4, the electronic device 400 further includes a chip package 402 (similar to the chip package 202) and a thermally conductive interface 404 (similar to the thermally conductive interface 204) between the chip package 402 and the sealed container 412 of the vapor chamber 410. As in FIGS. 2A and 2B, although a chip package 402 is illustrated in FIG. 4, the chip package 402 may instead be an image sensor, a power amplifier, or any other heat generating circuitry that would benefit from a cooling package.

As illustrated in FIG. 4, the electronic device 400 has a first outside cover 406 and a second outside cover 408. As an example, the first outside cover 406 may be the back cover of the electronic device 400 and the second outside cover 408 may be the front cover of the electronic device 400. The outside covers 406 and 408 may be metal or polymer, and may be coupled to each other by any means known in the art for coupling the outside covers of an electronic device. In the example of FIG. 4, the sealed container 412 is thermally coupled, via a thermally conductive interface 418, to the first outside cover 406 of the electronic device 400. The thermally conductive interface 418 may be grease, epoxy, solder, or any material that allows heat from the sealed container 412 to be transferred to the first outside cover 406. The thermally conductive interface 418 may extend beyond the outside edges of the vapor chamber 410 (as illustrated in FIG. 4), or may be flush with the edges of the vapor chamber 410. As shown in FIG. 4, the sealed container 412 conforms to a portion, rather than the entirety, of the inside back surface of the first outside cover 406.

As illustrated in FIG. 4, the area of the surface of the vapor chamber 410 coupled to the chip package 402 (i.e., the evaporator side of the vapor chamber 410) and the area of the surface of the vapor chamber 410 coupled to the first outside cover 406 (i.e., the condenser side of the vapor chamber 410) are greater than the area of the surface of the chip package 402 coupled to the vapor chamber 410. However, this is not required, and the surface area of the vapor chamber 410 may be larger or smaller, dependent on the design of the electronic device 400 and/or the first outside cover 406. As will be appreciated, however, the larger the vapor chamber (e.g., vapor chamber 100, 210, 310, 410), the larger the cooling benefit to the heat source (e.g., chip package 202, 302, 402). In general, even if the vapor chamber is not formed as a cover of the electronic device (as illustrated in FIGS. 2A and 2B), or does not conform to the entire inside back surface of an outside cover of the electronic device (as illustrated in FIG. 3), it is beneficial for the surface area of the vapor chamber to which the chip package and thermally conductive interface are coupled to be at least as large as the surface area of the chip package (as illustrated in FIG. 4). Additionally, although it is not necessary for the vapor chamber to be formed as a cover of the electronic device (as illustrated in FIGS. 2A and 2B), if it is instead coupled to the back cover of the electronic device (as illustrated in FIGS. 3 and 4), heat coming off the condenser side of the vapor chamber will need to pass through the outside cover of the electronic device, which may have a minimal effect on the efficiency of the vapor chamber.

Further, although small form factor electronic devices, such as cell phones, security cameras, wearable devices, IoT devices, etc., may benefit the most from utilizing the vapor chamber of the present disclosure, due to the fact that they typically do not have any cooling mechanism other than heat conduction through the outside covers of the device, larger devices would benefit as well. For example, the vapor chamber of the present disclosure can replace a typical heat sink and fan cooling package that are often mounted to larger chip packages, especially in desktop or server computers. Replacing a heat sink and fan cooling package with the vapor chamber of the present disclosure would eliminate the space, noise, and maintenance required by such a cooling package. In another aspect, for additional cooling efficiency, a fan can be added to the condenser side of the vapor chamber, such that the vapor chamber would replace only the heat sink of a heat sink and fan cooling package.

Further, the thickness of the vapor chamber (i.e., the dimension of the vapor chamber from the outside surface of the evaporator side to the outside surface of the condenser side) may be dictated by the specific application. For example, for larger heat sources, a thicker vapor chamber would be beneficial, whereas for smaller heat sources, a thinner vapor chamber may be sufficient. As an example, the thickness of a vapor chamber may be as thin as 0.6 mm. However, as will be appreciated, thinner or thicker vapor chambers are possible.

While the foregoing disclosure shows illustrative aspects of the disclosure, it should be noted that various changes and modifications could be made herein without departing from the scope of the disclosure as defined by the appended claims. The functions, steps and/or actions of the method claims in accordance with the aspects of the disclosure described herein need not be performed in any particular order. Furthermore, although elements of the disclosure may be described or claimed in the singular, the plural is contemplated unless limitation to the singular is explicitly stated.

What is claimed is:

1. An electronic device having a front outside cover and a back outside cover coupled to the front outside cover, the electronic device comprising:
   a heat generating component; and
   a vapor chamber comprising:
      a sealed container enclosing a cavity and having an evaporator side on one side of the cavity and a condenser side opposite the evaporator side, on an opposite side of the cavity;
      a wick structure disposed on an inner surface of the sealed container; and
      a fluid contained in the sealed container, wherein:
   the evaporator side of the sealed container is coupled to the heat generating component;
   the heat generating component is located between the vapor chamber and the front outside cover;
   the back outside cover has an inner surface;

the condenser side of the sealed container conforms to a shape of the inner surface of the back outside cover;
the condenser side of the sealed container is thermally coupled to the inner surface of the back outside cover;
the fluid comprises water;
an atmospheric pressure in the vapor chamber is below one (1) atmosphere of pressure to enable the water to vaporize at a temperature of less than 100 degrees Celsius; and
as heat is generated by the heat generating component, the fluid vaporizes on the evaporator side, through the cavity, over to the condenser side of the sealed container and returns to the evaporator side of the sealed container via the wick structure.

2. The electronic device of claim 1, wherein:
the condenser side of the sealed container is thermally coupled to the inner surface of the back outside cover via a thermally conductive interface.

3. The electronic device of claim 2, wherein the condenser side of the sealed container is coupled, via the thermally conductive interface, to less than an entirety of the inner surface of the back outside cover.

4. The electronic device of claim 2, wherein the condenser side of the sealed container is coupled, via the thermally conductive interface, to an entirety of the inner surface of the back outside cover.

5. The electronic device of claim 1, wherein the sealed container is aluminum or copper and the back outside cover is polymer.

6. The electronic device of claim 1, wherein the heat generating component comprises a chip package, an imaging sensor, or a power amplifier.

7. The electronic device of claim 1, wherein the device is one of a camera, a cell phone, a wearable device, and an Internet of Things (IoT) device.

8. The electronic device of claim 1, wherein the wick structure comprises sintered copper powder, a fibrous material, carbon fiber, copper or aluminum mesh, or grooves on the inner surface of the sealed container.

9. The electronic device of claim 1, wherein the heat generating component is thermally coupled to the vapor chamber via a thermally conductive interface.

10. The electronic device of claim 1, wherein a surface area of the evaporator side of the sealed container of the vapor chamber is greater than or equal to a surface area of the heat generating component.

11. An electronic device having a front outside cover and a back outside surface opposite the front outside cover, the electronic device comprising:
a heat generating component; and
a vapor chamber comprising:
a sealed container enclosing a cavity and having an evaporator side on one side of the cavity and a condenser side opposite the evaporator side, on an opposite side of the cavity;
a wick structure disposed on an inner surface of the sealed container; and
a fluid contained in the sealed container, wherein:
the evaporator side of the sealed container is coupled to the heat generating component;
the heat generating component is located between the vapor chamber and the front outside cover;
the front outside cover is coupled to the sealed container;
the condenser side of the sealed container forms the back outside surface of the electronic device; and
as heat is generated by the heat generating component, the fluid vaporizes on the evaporator side, through the cavity, over to the condenser side of the sealed container and returns to the evaporator side of the sealed container via the wick structure.

12. The electronic device of claim 11, wherein the sealed container is aluminum, copper, or polymer.

13. The electronic device of claim 11, wherein the heat generating component comprises a chip package, an imaging sensor, or a power amplifier.

14. The electronic device of claim 11, wherein the fluid comprises water, alcohol, or methanol.

15. The electronic device of claim 11, wherein the device is one of a camera, a cell phone, a wearable device, and an Internet of Things (IoT) device.

16. The electronic device of claim 11, wherein the wick structure comprises sintered copper powder, a fibrous material, carbon fiber, copper or aluminum mesh, or grooves on the inner surface of the sealed container.

17. An electronic device having a front outside cover and a back outside cover coupled to the front outside cover, the electronic device comprising:
a cooling means coupled to a heat generating means of the electronic device, wherein the cooling means comprises:
a sealed container enclosing a cavity and having an evaporator side on one side of the cavity and a condenser side opposite the evaporator side, on an opposite side of the cavity;
a wicking means disposed on an inner surface of the sealed container; and
a fluid contained in the sealed container, wherein:
the evaporator side of the sealed container is coupled to the heat generating means;
the condenser side of the sealed container conforms to a shape of the back outside cover of the electronic device;
the fluid comprises water;
an atmospheric pressure in the cooling means is below one (1) atmosphere of pressure to enable the water to vaporize at a temperature of less than 100 degrees Celsius; and
as heat is generated by the heat generating means, the fluid vaporizes on the evaporator side, through the cavity, over to the condenser side of the sealed container and returns to the evaporator side of the sealed container via the wicking means.

18. The electronic device of claim 1, wherein the inner surface of the back outside cover comprises multiple sections including walls that surround at least a part of the vapor chamber.

19. The electronic device of claim 18, wherein the condenser side of the sealed container is thermally coupled, via a thermally conductive interface, to multiple sections, including the walls, of the inner surface of the back outside cover.

20. The electronic device of claim 1, wherein the wick structure is disposed only on the inner surface of the sealed container.

* * * * *